ANODIC OXIDATION
Filed March 12, 1965
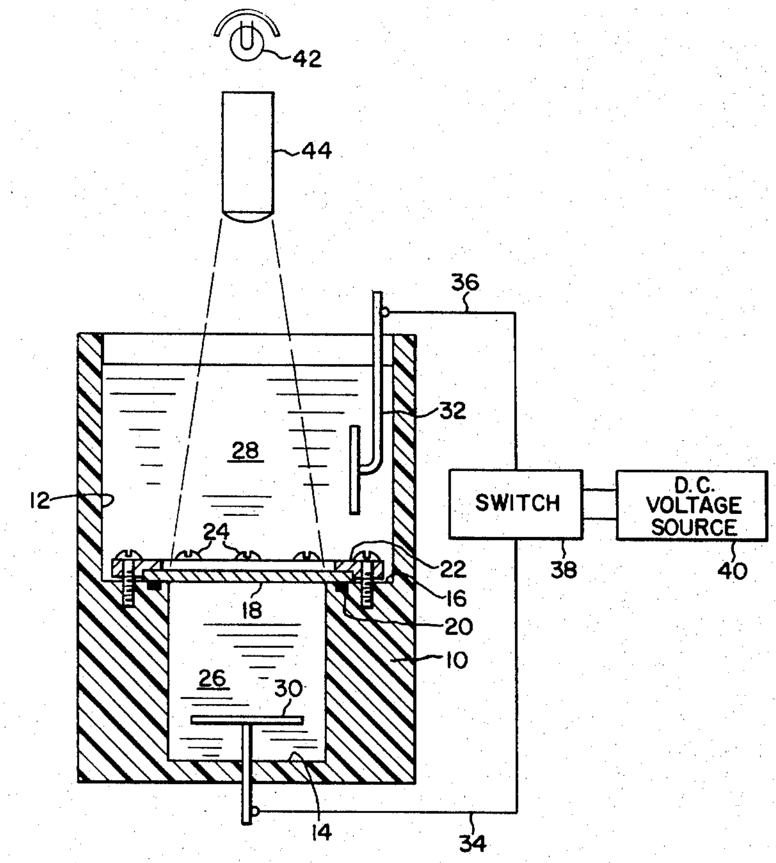
WITNESSES
Theodore F. Wrobel
James F. Young
INVENTOR
Paul F. Schmidt
BY
C. L. Menzemer
ATTORNEY United States Patent Office 3,419,480
Patented Dec. 31, 1968

3,419,480

ANODIC OXIDATION

Paul F. Schmidt, Allentown, Pa., assignor to Westinghouse Electric Corporation, Pittsburgh, Pa., a corporation of Pennsylvania Filed Mar. 12, 1965, Ser. No. 439,163
1 Claim. (Cl. 204—15)

ABSTRACT OF THE DISCLOSURE

This invention sets forth a method of forming doped oxide films on both sides of a silicon wafer by bringing different electrolytes in contact with opposite sides of the wafer and by establishing a potential between electrodes in the electrolytes grow a doped oxide coating on first one surface and then the other.

This invention relates to the production of anodic oxide films of the same or different composition on opposite sides of a silicon or other semiconductor wafer, and more particularly to the production of anodic oxide films on opposite sides of a silicon wafer without making metallic contact to the wafer.

As is known, oxide films can be grown on the surface of a silicon wafer by means of an anodization process. In the past, this has usually been accomplished by immersing the wafer within an oxide-forming electrolyte, the wafer having one end of an electrical lead connected thereto. The other end of the lead is connected to the positive terminal of a direct current voltage source such that the wafer becomes the anode within the electrolyte; while the negative terminal of the same voltage source is connected to an inert cathode, such as platinum, also immersed in the electrolyte.

In certain cases, it is necessary or desirable to coat opposite sides of a silicon wafer with different oxide coatings. For instance, it may be desirable to deposit a phosphorus-doped oxide on one side of the wafer prior to a diffusion process, and to deposit an essentially pure silicon dioxide layer on the other side. In conventional techniques wherein an electrical lead is secured to the wafer, two separate anodization steps, and possibly intermediate masking techniques, would be required in successive tanks containing different electrolytes.

As one object, the present invention provides a method for producing anodic oxide films on opposite sides of a silicon wafer in a single process by simply reversing the polarity of an applied anodizing potential.

Another object of the invention is to provide a method for producing anodic oxide films of the same or different composition on opposite sides of a silicon wafer.

A further object of the invention lies in the provision of a method for producing in a single anodization cell oxide layers of different thickness on opposite sides of a semiconductor wafer.

Another object of the invention is to provide a method for producing anodic oxide films on opposite sides of a silicon wafer without making metallic contact to the wafer.

Still another object of the invention is to provide circular anodized oxide patterns as required for power device applications.

Finally, an object of the invention is to provide apparatus for carrying out the foregoing methods.

In accordance with the invention, a silicon wafer is made the separating wall between two electrolytic compartments which contain different electrolytes. Extending into the electrolyte in each compartment, and spaced from the silicon wafer, is an inert electrode of platinum or the like. When a direct current bias is applied between the two inert electrodes, oxide growth will occur on the side of the silicon wafer facing the negative electrode. However, no oxide will form on the side facing the positive electrode; and hydrogen will plate out here, assuming the absence of platable metal ions in the electrolyte.

If the polarity of the direct current bias applied to the electrodes is reversed, then oxide growth will occur on the side on which hydrogen previously plated out. The oxide-covered side of the silicon disc is now negatively polarized with respect to the electrolyte on that side of the silicon disc; and under these circumstances anodic oxide films on silicon, as well as on other metals, are reasonably good conductors of electricity due to the phenomenon of electrolytic rectification. It is due to this latter effect that growth of an oxide film on the previously bare surface of the wafer is possible under the given conditions.

Provided that the electrolyte solutions on opposite sides of the silicon disc are different, oxides of different composition can be grown on the two sides of the disc. For example, an N-type doped oxide can be grown on one side, and a P-type doped or neutral oxide on the other side, or vice versa.

The above and other objects and features of the invention will become apparent from the following detailed description taken in connection with the accompanying single figure drawing which schematically illustrates an embodiment of the invention.

With reference now to the drawing, a container 10 is shown formed from polytetrafluoroethylene or some other suitable material such as glass which is chemically inert with respect to the electrolytes employed in the invention. The container 10 comprises an upper compartment 12 of relatively large diameter, and a lower reduced diameter compartment 14. Supported on an annular shoulder 16 formed in the container 10 between compartments 12 and 14 is a silicon disc 18 which rests on an O-ring seal 20. The disc 18 is held in place against the seal 20 by means of a ring clamp 22 secured to the container 10 by means of a plurality of polytetrafluoroethylene screws 24 which pass through openings in the clamp 22 and are threaded into the lower wall of the container surrounding the reduced diameter compartment 14. With the arrangement shown, a fluid-tight sealing arrangement is provided between the two compartments 12 and 14.

Prior to placement of the wafer 18 in the position shown, the lower compartment 14 is completely filled with an oxide-forming electrolyte 26. When the lower compartment 14 is thus filled, the disc 18 is clamped in place and a second oxide-forming electrolyte 28 poured into the upper compartment 12.

Extending through the lower wall of compartment 14 and into the electrolyte 26 is an inert electrode 30, such as platinum. Similarly, a second electrode 32 formed from an inert material such as platinum extends downwardly into the electrolyte 28. The electrodes 30 and 32 are connected through leads 34 and 36 and a switch 38 to a source of direct current voltage, indicated generally by the reference numeral 40. The switch 38 is such that it is capable of either: (1) disconnecting the voltage source 40 from electrodes 30 and 32, (2) connecting electrode 32 to the positive terminal of source 40 and electrode 30 to the negative terminal, or (3) reversing the polarity of the voltage applied to electrodes 30 and 32 with respect to the case given above such that electrode 30 is positive and electrode 32 negative.

Also included in the apparatus is a source of light, such as a conventional incandescent light bulb 42 which is focused through a lens systems 44 onto the upper surface of the wafer 18.

The type of electrolyte contained within compartment 12 or 14 depends upon whether the wafer 18 is P-type or N-type, and whether the oxide is to be doped or non-doped. For example, if the wafer 18 is P-type, and assuming that its upper surface is to be coated with an N-doped oxide for emitter diffusion, the electrolyte 28 may comprise a solution of pyrophosphoric or phosphorous acid in tetrahydrofurfuryl alcohol. For collector diffusion, and assuming again that the wafer 18 is P-type silicon, the electrolyte preferably comprises a mixture of diethyl phosphate, potassium nitrite and tetrahydrofurfuryl alcohol. In either case given above, the dopant element is, of course, phosphorus. However, electrolytes containing any N-type ion, particularly antimony and arsenic, may be employed.

If the lower surface of the wafer 18 is to be coated with a non-doped oxide, the electrolyte 26 within compartment 14 may comprise a solution of potassium nitrite and tetrahydrofurfuryl alcohol, or ammonium pentaborate in aqueous solution.

Assuming that the switch 38 is positioned such that the electrode 32 is negative with respect to electrode 30, oxide growth will occur on the upper surface of the wafer or disc 18. During this time, hydrogen will plate out at the lower surface of the disc. If, now, the polarities of the electrodes 30 and 32 are reversed such that electrode 30 is negative with respect to electrode 32, an oxide film will grow on the lower surface of the wafer 18. As mentioned above, the oxide covering on the upper surface of wafer 18 is now negatively polarized with respect to the electrolyte on that side of the silicon disc. Under these circumstances, the anodic oxide film is a reasonably good conductor of electricity due to the phenomenon of electrolytic rectification.

If desired or necessary, one or both sides of the wafer 18 may be masked by conventional photoresist or oxide masking techniques in order to cause the formation of the anodic oxides on one or both sides of the wafer at selected areas only.

To this point, the process has been described in connection with a P-type silicon wafer. If the wafer 18 should be of N-type silicon, and assuming that its resistivity is above about 0.2 ohm per square centimeter, it is necessary, for oxide growth, to illuminate it by means of the light source 42 and lens system 44. As is known, a prerequisite to anodic oxide growth is the availability of an excess of P-type carriers (holes); whereas N-type silicon normally has an excess of N-type carriers (i.e., electrons). Growth of anodic oxide films on N-type silicon, therefore, depends upon the availability of minority carriers (i.e., holes) at the surface. Electrolyte contacts to silicon such as those shown in the drawing do not inject minority carriers. Consequently, it is necessary to illuminate the wafer for the purpose of injecting optically the necessary minority carriers. Illumination is, however, also required on higher resistivity P-type silicon in order to inject electrons for the cathode reaction (plating out of hydrogen).

If it is desired to form a non-doped oxide layer on one or both sides of an N-type wafer, the electrolyte may again comprise potassium nitrite and tetrahydrofurfuryl alcohol or ammonium pentaborate in aqueous solution. On the other hand, if it is desired to form a P-doped anodic oxide film on one or both sides of the N-type wafer, the electrolyte must contain an ion of the desired P-type dopant. If the P-type dopant is boron, for example, the electrolyte may comprise polyhedral borane acids and tetrahydrofurfuryl alcohol.

It will be appreciated that if the wafer is circular and the clamping device also circular, the resulting product has central, circular oxide areas on both sides, as is required in power device applications.

The following examples are illustrative of the teachings of the invention.

EXAMPLE I

A wafer of P-type silicon, after lapping, electropolishing or etching was clamped in place between two electrolytic compartments in an arrangement similar to that shown in the drawing. The lower compartment contained ammonium pentaborate in aqueous solution, and the upper compartment contained a mixture of diethyl phosphate, potassium nitrite and tetrahydrofurfuryl alcohol. Both electrolytes were maintained at a temperature of about 25° C.

A potential was established between electrodes, such as electrodes 30 and 32, on opposite sides of the P-type wafer with the upper electrode being negative with respect to the lower electrode. A current density of about 6 milliamperes per square centimeter was established until the forming voltage reached 100 volts. During this time, a phosphorus-doped oxide film grew on the upper surface of the wafer, with hydrogen plating out at the lower surface. Upon reaching a forming voltage of 100 volts and by keeping this voltage constant for about 10 minutes, a phosphorus-doped oxide layer of 580 Angstrom units thickness was formed on the upper surface.

The polarities of the electrodes were then reversed, and a current density of 5 milliamperes per square centimeter established until the forming voltage reached 100 volts. In this process, a non-doped oxide film was grown on the lower surface of the silicon wafer until the thickness of the film was 1000 Angstrom units. In this respect, it will be appreciated that ammonium pentaborate in aqueous solution does not incorporate boron into the anodic oxide film.

EXAMPLE II

A wafer of N-type silicon, processed in the same manner as the wafer of Example I, was clamped in place between two electrolytic compartments, the lower compartment of which contained a polyhedral borane acid solution and the upper compartment of which contained a mixture of potassium nitrite and tetrahydrofurfuryl alcohol. Both electrolytes were again maintained at a temperature of about 25° C.

A potential was established between electrodes, such as electrodes 30 and 32, with the upper electrode being negative with respect to the lower electrode. A current density of about 5 milliamperes per square centimeter was established. Without external illumination, no oxide growth occurred. However, when the wafer was illuminated by an external light source such as source 42 shown in the drawing, and with the upper electrode 32 negative with respect to the lower electrode, a non-doped oxide film grew on the upper surface of the wafer, with hydrogen again plating out at the lower surface. Upon reaching a forming voltage of 130 volts and by again keeping this voltage constant for about ten minutes, an oxide layer of about 900 Angstrom units thickness was formed on the upper surface.

By reversing the polarities of the electrodes, and at a current density of 5 milliamepres per centimeter, a P-type doped oxide film was grown on the lower surface of the silicon wafer to a forming voltage of 150 volts, at which point the thickness of the film on the lower surface was about 600 Angstrom units.

EXAMPLE III

A wafer of N-type silicon, processed in the manner described in connection with Example I, was again clamped in place between two electrolytic compartments, the lower compartment of which contained a polyhedral borane acid solution and the upper compartment of which contained a phosphoric acid solution. Upon application of a potential between electrodes corresponding to elements 30 and 32 shown in the drawing, no appreciable oxide growth occurred in the absence of external illumination. When, however, the wafer was illuminated, and at a current density of 5 milliamperes per square centimeter, an oxide layer of 500 Angstrom units grew on the upper surface of the wafer to a forming voltage of about 90 volts. Reversal of the polarity at the same current density caused formation of an oxide layer on the lower surface of the wafer to a forming voltage of 125 volts (750 Angstrom units thickness).

EXAMPLE IV

A wafer of P-type silicon, processed in the manner described in connection with Example I, was clamped in place between two electrolytic compartments, the upper compartment of which contained a mixture of diethyl phosphate, potassium nitrite and tetrahydrofurfuryl alcohol, and the lower compartment of which contained a polyhedral borane acid solution. Upon application of a potential to the electrodes with the upper electrode being negative, an N-type doped oxide film grew on the upper surface at a current density of 7 milliamperes per square centimeter until the forming voltage reached 150 volts. The thickness of the resulting oxide film was 1100 Angstrom units. Reversal of the polarity applied to the electrodes at the same current density resulted in the growth of an oxide film to 130 volts on the bottom of the wafer, the thickness of the film being 900 Angstrom units.

Although the invention has been described in connection with certain specific embodiments, it will be readily apparent to those skilled in the art that various changes can be made therein without departing from the spirit and scope of the invention.

I claim as my invention:

1. In the method for forming a doped anodic oxide coating on opposite sides of a silicon wafer, the steps of:

(1) bring different electrolytes containing a dopant ion into contact with opposite sides of a silicon wafer, (2) establishing a potential between inert electrodes disposed within the respective electrolytes such that a doped oxide film will grow on the one side of the wafer facing the negative electrode, and (3) reversing the polarity of the potential applied to the electrodes such that a doped oxide film will grow on the opposite side of the wafer with current flowing through the previously formed doped oxide on said one side by virtue of electrolytic rectification.

References Cited

UNITED STATES PATENTS 3,345,274 10/1967 Schmidt ------------ 204—15
3,010,885 11/1961 Schink ------------- 204—32

HOWARD S. WILLIAMS, *Primary Examiner.*

T. TUFARIELLO, *Assistant Examiner.*